United States Patent [19]
Hajmrle et al.

[11] Patent Number: 6,037,065
[45] Date of Patent: Mar. 14, 2000

[54] SPHERES USEFUL IN A DETACHABLE CONNECTIVE MEDIUM FOR BALL GRID ARRAY ASSEMBLIES

[75] Inventors: Karel Hajmrle; Kenneth G. Reid; Anthony P. Chilkowich; James B. Ramsden, all of Fort Saskatchewan, Canada

[73] Assignee: The Westaim Corporation, Fort Saskatchewan, Canada

[21] Appl. No.: 09/029,248

[22] PCT Filed: Dec. 19, 1996

[86] PCT No.: PCT/CA96/00863

§ 371 Date: Jul. 7, 1998

§ 102(e) Date: Jul. 7, 1998

[87] PCT Pub. No.: WO97/23121

PCT Pub. Date: Jun. 26, 1997

Related U.S. Application Data

[60] Provisional application No. 60/008,886, Dec. 19, 1995.

[51] Int. Cl.[7] .................................................. B23K 35/02
[52] U.S. Cl. ........................ 428/570; 428/643; 428/645; 428/646; 428/647; 428/648
[58] Field of Search ..................................... 428/570, 643, 428/645, 646, 673, 647, 648, 672; 228/56.3

[56] References Cited

U.S. PATENT DOCUMENTS

| | | |
|---|---|---|
| 5,086,966 | 2/1992 | Melton et al. . |
| 5,093,986 | 3/1992 | Mandai et al. . |
| 5,324,569 | 6/1994 | Nagesh et al. . |
| 5,341,980 | 8/1994 | Nishikawa et al. . |
| 5,400,220 | 3/1995 | Swamy . |

FOREIGN PATENT DOCUMENTS

| | | |
|---|---|---|
| 0 084 464 | 7/1983 | European Pat. Off. . |
| 0 650 795 | 5/1995 | European Pat. Off. . |

OTHER PUBLICATIONS

Patent Abstracts of Japan, vol. 11, No. 325 (E–551), Oct. 22, 1987 and JP 62 112355, May 23, 1987—NGK Spark Plug Co.

*Primary Examiner*—Deborah Jones
*Assistant Examiner*—Jason Savage
*Attorney, Agent, or Firm*—Arne I. Fors

[57] ABSTRACT

A connective medium is provided for use in ball grid assemblies for detachable connections between electronic devices and circuit boards. The medium includes novel, discrete spheres defining an inner metallic, spherical core and one or more outer, electrically conductive concentric, hard and non-deformable metallic layers of nickel, copper or alloys thereof and a coating of silver or gold thereon.

6 Claims, 3 Drawing Sheets

SPHERES USEFUL IN A DETACHABLE CONNECTIVE MEDIUM FOR BALL GRID ARRAY ASSEMBLIES

This application is the national phase of international application PCT/CA96/00863 filed Dec. 19, 1996 which was designated the U.S.

FIELD OF THE INVENTION

The present invention relates to novel, discrete, spheres useful as a connective medium to detachably connect electronic devices to circuit boards.

BACKGROUND OF THE INVENTION

It is commonly known to use solder alloy spheres for providing permanent connections between electronic devices and circuit boards. Typically, the composition of the spheres used is 63% tin and 37% lead, it being understood that all percentages used herein are by weight.

These discrete spheres of solder alloy are used as the connective medium in systems called ball grid arrays. Adhesion between the discrete spheres and the electronic device is achieved by printing a solder paste containing 63% tin and 37% lead onto the mounting pads of both the board and the electronic device. The solder paste and solder spheres are remelted on the electronic device to thereby attain sphere attachment thereto. Subsequently, die circuit board is positioned under the sphere laden device, the solder paste on the board being remelted, to effect a permanent bond between the device and the circuit board. Once the permanent bond between the device and circuit board has been effected, the device cannot be removed unless the solder is remelted which requires temperatures above 183° C.

U.S. Pat. No. 5,324,569 issued Jun. 28, 1994 entitled Composite Transversely Plastic Interconnect for Microchip Carrier discloses microcarrier pin-out arrays used in integrated circuits in which transversely plastic interconnects join a microcarrier to a substrate of dissimilar material. Solder balls having a high melting temperature are coated with a thin (several microns thick) barrier metal layer to prevent reaction between the solder balls and low melting temperature solder paste and to keep the solder ball microsphere shape during reflow. However, the thin solder ball coating necessary to allow transverse plasticity in the balls to compensate for thermal coefficient of expansion mismatch between the microcarrier and the substrate renders the coated spheres easily deformable.

U.S. Pat. No. 5,093,986 issued Mar. 10. 1992 entitled "Method of Forming Bump Electrodes" discloses a method of producing bump electrodes which consist of adhesively securing metal balls to a circuit board by a conductive paste containing a metal such as Cu or Ag or an Ag—Pb alloy and firing at 850° to 1000° C. to fix the balls to the circuit board. The balls may be plated to render them rust resistant.

There exist important reasons which make it desirable to provide a ball grid array assembly connective medium which provides a non-permanent, or releasable connection between the device and the board. Exemplary reasons involve replacement of a failed device, or substitution by an upgraded model. Alternatively, it may be desirable to delay the final assembly of units until after shipment.

The prior art has contemplated the use of interconnecting pins functional as the connective medium to releasably attach the electronic device to the circuit board. Deleteriously, such methods have not only proved expensive but have been further found to be extremely fragile and difficult to implement.

Proprietary technology, which was, however, not developed by the present assignee, under investigation is exploring the viability of providing removably detachable or 'pluggable' contacts between device and board which would provide easy engagement and disengagement therebetween. Such pluggable contacts typically comprise an array U.S. Pat. No. 5,324,569 issued Jun. 28, 1994 entitled Composite Transversely Plastic Interconnect for Microchip Carrier discloses microcarrier pin-out arrays used in integrated circuits in which transversely plastic interconnects join a microcarrier to a substrate of dissimilar material. Solder balls having a high melting temperature are coated with a thin (several microns thick) barrier metal layer to prevent reaction between the solder balls and low melting temperature solder paste and to keep the solder ball microsphere shape during reflow. However, the thin solder ball coating necessary to allow transverse plasticity in the balls to compensate for thermal coefficient of expansion mismatch between the microcarrier and the substrate renders the coated spheres easily deformable.

There exist important reasons which make it desirable to provide a ball grid array assembly connective medium which provides a non-permanent, or releasable connection between the device and the board. Exemplary reasons involve replacement of a failed device, or substitution by an upgraded model. Alternatively, it may be desirable to delay the final assembly of units until after shipment.

The prior art has contemplated the use of interconnecting pins functional as the connective medium to releasably attach the electronic device to the circuit board. Deleteriously, such methods have not only proved expensive but have been further found to be extremely fragile and difficult to implement.

Proprietary technology, which was, however, not developed by the present assignee, under investigation is exploring the viability of providing removably detachable or 'pluggable' contacts between device and board which would provide easy engagement and disengagement therebetween. Such pluggable contacts typically comprise an array of spheres soldered to the device and an array of spring-loaded sphere-receiving contacts mounted on an interconnecting member adapted to be permanently attached to the circuit board, said interconnecting member and board having electrical contact points at predetermined sites.

Thus, when the device must be replaced, for example because of failure or a desire to substitute a device having upgraded performance, the spheres and spring-loaded spheres receiving contacts are pulled apart, or conversely to interlock the device and board, are gently pressed together. The spheres must be hard and not deformable to maintain their sphericity and to avoid creep due to the pressure of top engagement contacts (FIG. 3). Transversely plastic spheres accordingly are not suitable.

SUMMARY OF THE INVENTION

In accordance with the present invention, there is provided a connective medium for use in ball grid array assemblies for releasably connecting electronic devices to circuit boards. There are provided highly electrically conductive spheres using readily available low cost core materials which are coated with metals selected from gold, silver, nickel, copper or alloys thereof. Spheres having more than one layer of metal coating thereover are also contemplated. Properties of the sphere, for example hardness, deformability, solderability, electrical conductivity and oxidation resistance, can be controlled by the nature of the coating, its thickness and the like.

It is to be noted that in the case of spheres having a solder core that the thickness of the metallic coating or coatings will depend upon the desired hardness and non deformability of the spheres and the pressure of the spring-loaded contacts. The coating thickness is selected as the minimum which will ensure no deformation of the solder sphere at minimum cost. In the case of spheres having a steel core, annealing treatments can be used to control the surface hardness.

More specifically, the invention extends to, in a first aspect, solder balls coated with one or more hard, non-deformable electrically conductive metal or metal alloy layers. The solder balls are easy to manufacture since their melting point is low and excellent sphericity with narrow particle size distribution is easily obtainable using known techniques. Deleteriously, solder balls per se are impractical for the present technology due to the melting and deformation thereof during soldering and surface oxidation and creep problems arising during use. It has been determined, however, that the advantages of using solder balls may be exploited by the application of a concentric metal coating or layer(s) thereover, whereby the problems inherent with using solder balls per se may be overcome. A layer thickness of at least about 30 micrometers is preferred to provide desired hardness and non-deformability. Such a metal layer (s) would exhibit the desired hardness and non-deformability properties in combination with a high melting point and good oxidation resistance. The preferred metals would include nickel, copper, silver, gold or alloys thereof. Advantageously, the coating process is low cost and thus economically viable.

Furthermore, the spheres may be manufactured from a metal having the desired hardness property using, for example, ball bearing manufacturing technology. These hard balls which per se lack the desired oxidation properties, may be subsequently coated with a suitable metal layer. Such metals would be selected from copper, nickel, silver, gold and alloys thereof.

A solder layer may be coated over the outer metallic layer of solder balls or hard balls.

DESCRIPTION OF THE DRAWINGS

The present invention will be better understood with reference to the detailed description below and the attached drawings.

DESCRIPTION OF PREFERRED EMBODIMENT

Figure 1A:
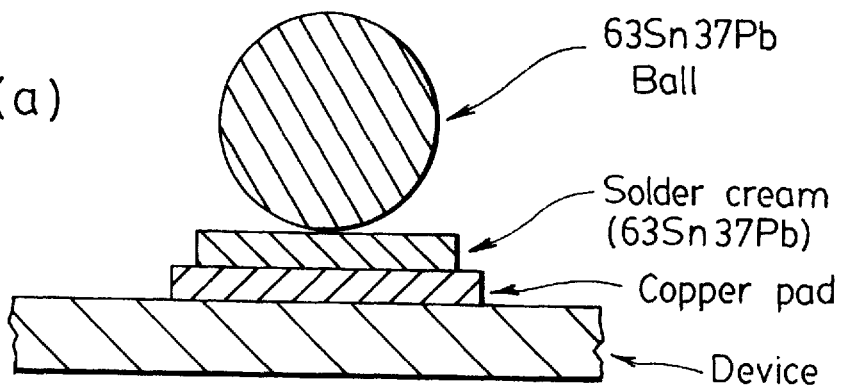
FIGS. 1(a) and 1(b) are schematic views of presently used prior art technology for attaching solder balls to an electronic device, FIG. 1(a) showing a solder ball prior to attachment and FIG. 1(b) showing a solder ball after attachment to an electronic device.
Figure 1B:
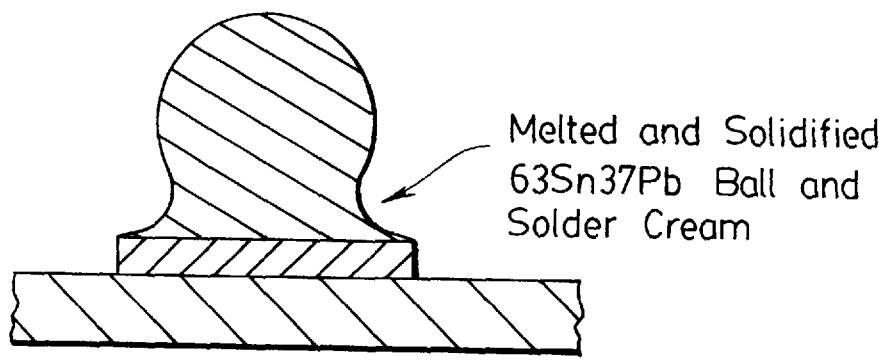
Figure 2:
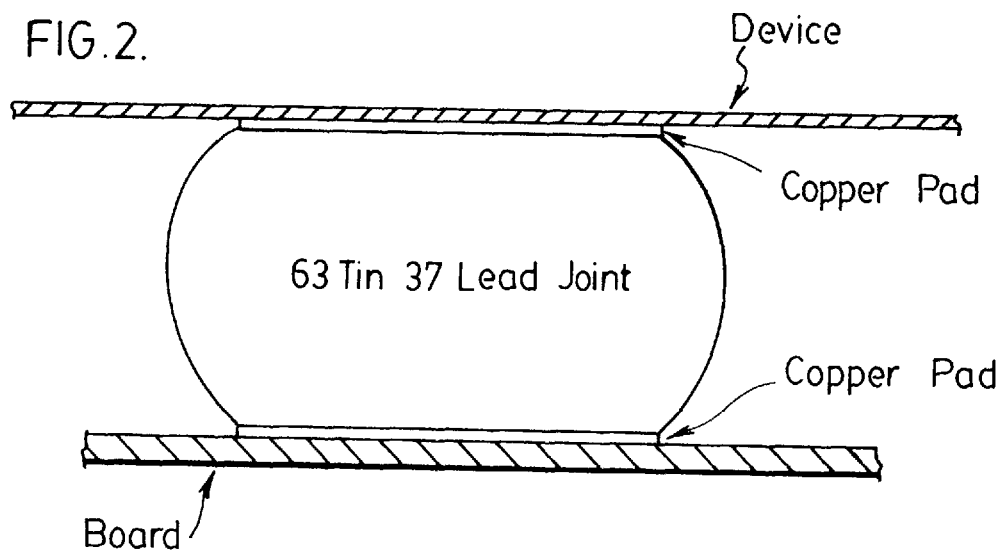
FIG. 2 is a detailed schematic view showing the current technology for attaching electronic devices to boards using solder balls.
Figure 3A:
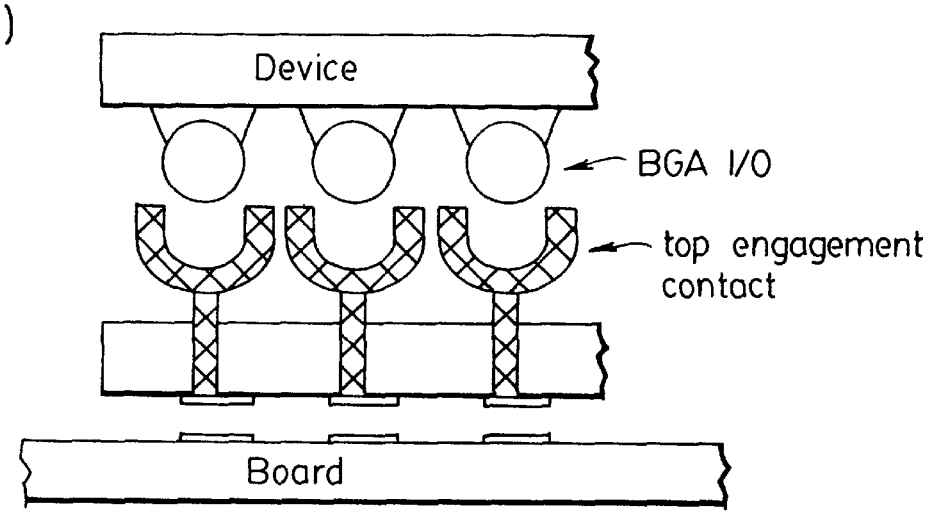
FIGS. 3(a) and 3(b) are schematic views showing key elements of the generic 'pluggable' ball grid array systems presently under investigation, FIG. 3(a) showing the elements prior to interconnection and FIG. 3(b) showing the elements after interconnection.
Figure 3B:
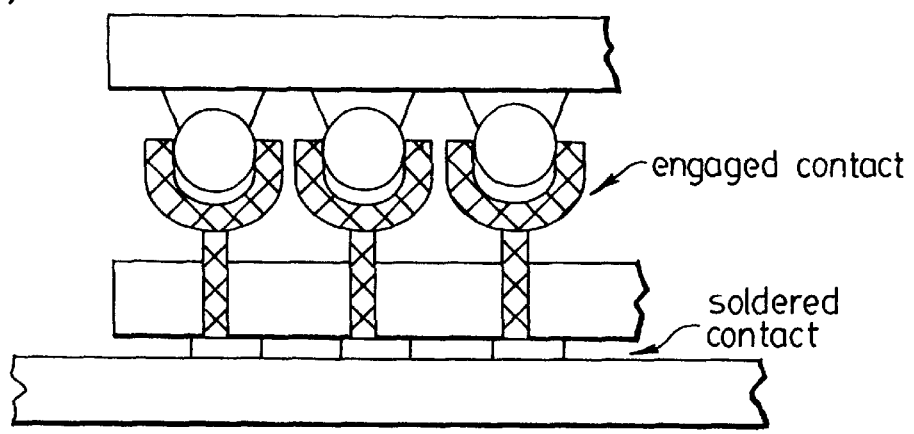
Figure 4A:
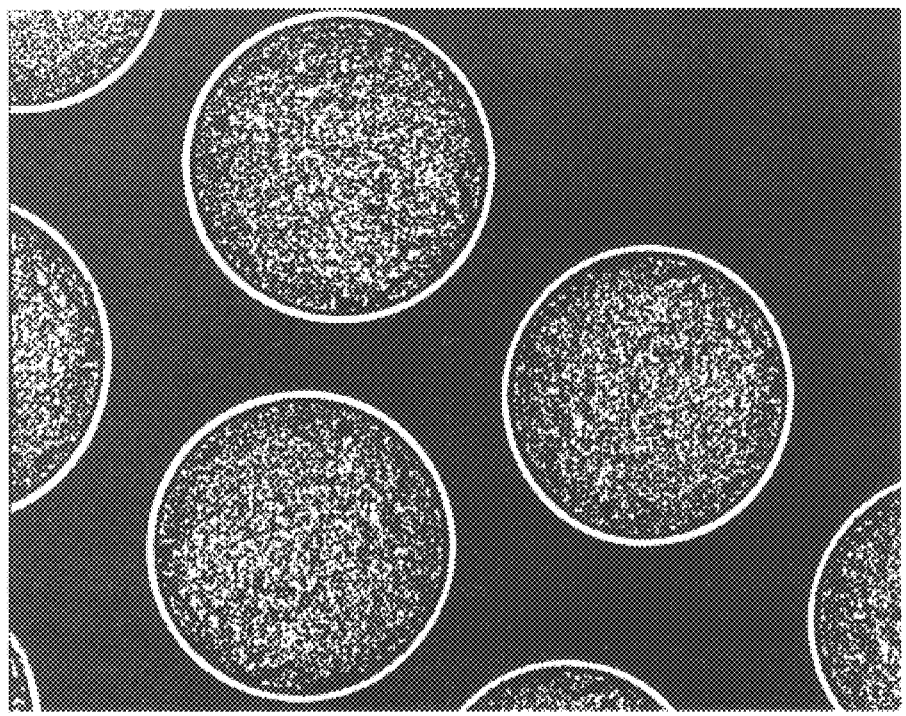
FIGS. 4(a) and 4(b) are photomicrographs of a cross-section of a sphere having a 90% lead/10% tin core and a copper coating, FIG. 4(a) representing a 50×magnification and FIG. 4(b) representing a 200×magnification.
Figure 4B:
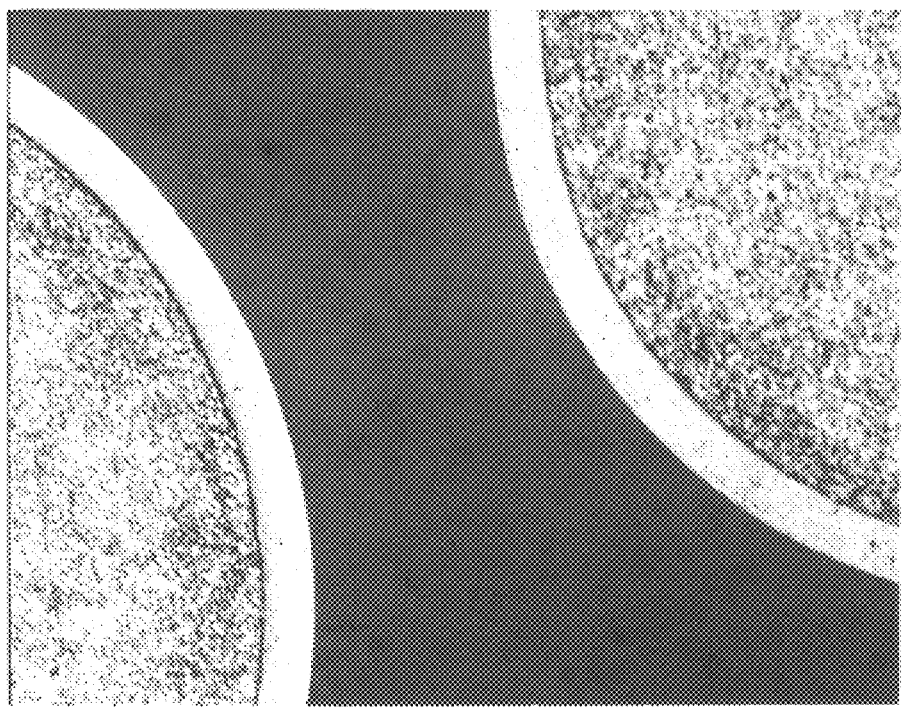

The spheres of the present invention may comprise a solder core based on conventional tin, lead, and silver compositions. The three most common compositions used are 63% Sn, 37% Pb; 62% Sn, 36% Pb, 2% Ag; and 90% Pb, 10% Sn. The solder core is coated with a copper, silver or nickel concentric layer so as to make it stronger and less deformable. If superior oxidation resistance, is required a very thin layer of gold may be deposited as tie outermost concentric layer on the ball. The spheres are then soldered in the ball grid array to the electronic device using printed solder paste. If necessary the solder may be plated onto the sphere, i.e. the ball would carry its own solder which would be used to attach it to the electronic device.

The core spheres may also be produced from metals or alloys having melting points above 800° C. In this case the temperature capability of the coated core would extend above 800° C. since the core and the coating metal or alloy are selected to melt above that temperature.

The metal coating of the core material may be effected by several techniques, such as hydrometallurgical coating in a solution at elevated temperature and pressure. Electroless plating, electroplating, physical vapour deposition, chemical vapour deposition and other processes may also be utilized.

The production of the core sphere may be effected by wire chopping and oil spheroidization in the case of solder core. The steel core can be produced by known technology for ball bearing production.

The following non-limitative examples are provided to demonstrate the operability of the invention.

EXAMPLE I

Solder balls made from 90% lead and 10% tin and having diameters of 889±25 microns were purchased from Alpha Metals Inc. The balls were subsequently electroplated with a 35 micrometer thick copper lacer. The resultant copper coating was continuous and bright.

EXAMPLE II

Brass balls of 70% copper, 30% zinc composition were produced using standard ball bearing manufacturing techniques. The ball diameter was 807±10 microns. The balls were coated with a 3 micrometer thick silver layer. The resultant silver coating was shown to be continuous and bright.

We claim:

1. A hard, non-deformable connective medium for use in ball grid array assemblies for detachably connecting electronic devices to circuit boards having spring-loaded sphere-receiving contacts comprising: discrete, electrically conductive spheres having a spherical, metallic solder core coated with one or more hard, non-deformable, electrically conductive concentric metallic layers having a total thickness of at least 30 micrometers selected from nickel and copper or alloys thereof and a coating of silver or gold thereon.

2. The connective medium as set forth in claim 1 wherein said spheres comprise a solder core having a lead and tin or lead, tin and silver solder composition.

3. The connective medium as set forth in claim 2 wherein said solder core is about 63% tin and 37% lead.

4. The connective medium as set forth in claim 2 wherein said solder core is approximately 62% tin, 36% lead and 2% silver.

5. The connective medium as set forth in claim 2 wherein said solder core is approximately 90% lead and 10% tin.

6. The connective medium as set forth in claim 2 wherein said solder core is coated with one or more metal layers selected from nickel, copper, silver, gold or alloys thereof.

* * * * *